United States Patent
Kim et al.

(10) Patent No.: US 12,230,924 B2
(45) Date of Patent: Feb. 18, 2025

(54) CONNECTOR STRUCTURE FOR ANTENNA, ANTENNA PACKAGE AND IMAGE DISPLAY DEVICE

(71) Applicant: DONGWOO FINE-CHEM CO., LTD., Jeollabuk-do (KR)

(72) Inventors: Young Ju Kim, Gyeonggi-do (KR); Byung Jin Choi, Incheon (KR); Han Sub Ryu, Gyeongsangbuk-do (KR); Na Yeon Kim, Seoul (KR); Dong Pil Park, Incheon (KR); Jae Hyun Lee, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 459 days.

(21) Appl. No.: 17/673,048

(22) Filed: Feb. 16, 2022

(65) Prior Publication Data
US 2022/0263276 A1    Aug. 18, 2022

(30) Foreign Application Priority Data

Feb. 18, 2021 (KR) .................. 10-2021-0021695
Feb. 26, 2021 (KR) .................. 10-2021-0026098

(51) Int. Cl.
*H01R 13/6585* (2011.01)
*H01Q 1/22* (2006.01)
(Continued)

(52) U.S. Cl.
CPC ....... *H01R 13/6585* (2013.01); *H01Q 1/2283* (2013.01); *H01Q 1/52* (2013.01); *H01R 12/7076* (2013.01); *H01R 12/79* (2013.01); *H01R 12/57* (2013.01); *H01R 12/65* (2013.01); *H01R 2201/02* (2013.01);
(Continued)

(58) Field of Classification Search
CPC ........ H01R 12/57; H01R 12/65; H01R 12/79; H01R 12/7076; H01R 2201/02; H01R 13/6585; H05K 2201/10098; H05K 2201/10189; H05K 1/189; H01Q 1/52; H01Q 1/2283; H01Q 1/243
See application file for complete search history.

(56) References Cited

U.S. PATENT DOCUMENTS 5,154,625 A * 10/1992 Borokowski .......... H01R 12/82
                                                                                  439/161
9,706,660 B1 * 7/2017 Mostoller ................ H05K 1/18
(Continued)

FOREIGN PATENT DOCUMENTS

KR   10-2013-0095451 A    8/2013
RU        2653589 C1 *    5/2018 ............... H01Q 1/38

*Primary Examiner* — Marcus E Harcum
(74) *Attorney, Agent, or Firm* — The PL Law Group, PLLC

(57) ABSTRACT

A connector structure according to an embodiment of the present disclosure includes a second connector and a first connector coupled to the second connector. The first connector includes a first insulator, a first conductive connection terminal disposed on the first insulator, a second conductive connection terminal spaced apart from the first conductive connection terminal to form a single row structure on the first insulator together with the first conductive connection terminal, and a first barrier structure disposed between the first conductive connection terminal and the second conductive connection terminal on the first insulator.

15 Claims, 8 Drawing Sheets

(51) Int. Cl.
  *H01Q 1/52*   (2006.01)
  *H01R 12/70*  (2011.01)
  *H01R 12/79*  (2011.01)
  *H01R 12/57*   (2011.01)
  *H01R 12/65*   (2011.01)
  *H05K 1/18*    (2006.01)

(52) U.S. Cl.
  CPC ... *H05K 1/189* (2013.01); *H05K 2201/10098* (2013.01); *H05K 2201/10189* (2013.01)

(56) References Cited

U.S. PATENT DOCUMENTS

| | | | | |
|---|---|---|---|---|
| 10,666,843 B2* | 5/2020 | Li | ............................ | H04N 23/54 |
| 11,019,736 B2* | 5/2021 | Woo | ........................ | H05K 3/365 |
| 11,379,009 B2* | 7/2022 | Hyun | ....................... | H05K 5/04 |
| 11,490,515 B2* | 11/2022 | Iwasaki | ................. | H05K 1/144 |
| 11,509,083 B2* | 11/2022 | Lee | ........................ | G06F 1/1626 |
| 2013/0169891 A1* | 7/2013 | Hirashima | ........... | H01R 12/724 |
| | | | | 348/836 |
| 2019/0296417 A1* | 9/2019 | Maruyama | ............. | H01Q 1/526 |
| 2020/0127404 A1* | 4/2020 | Seo | ........................ | H01R 12/79 |
| 2020/0153114 A1* | 5/2020 | Wada | ................... | H01Q 21/065 |
| 2020/0244011 A1* | 7/2020 | Kitazawa | ........... | H01R 13/6585 |
| 2020/0393936 A1* | 12/2020 | Bok | ...................... | G06F 3/0448 |
| 2021/0167487 A1* | 6/2021 | Varma | ..................... | H01Q 1/38 |
| 2021/0175665 A1* | 6/2021 | Someya | ............... | H01R 13/405 |
| 2021/0210912 A1* | 7/2021 | Yang | .................... | H01R 13/639 |
| 2021/0235576 A1* | 7/2021 | Nagai | ................... | H05K 1/0237 |
| 2021/0305739 A1* | 9/2021 | Ghim | ................. | H04M 1/0277 |
| 2021/0318730 A1* | 10/2021 | Lee | ........................ | H01Q 21/24 |
| 2021/0384662 A1* | 12/2021 | Lee | ........................ | H01R 12/79 |
| 2022/0094088 A1* | 3/2022 | Teruki | ............... | H01R 13/6582 |
| 2022/0374048 A1* | 11/2022 | Niu | ..................... | G06F 3/04164 |

* cited by examiner

CONNECTOR STRUCTURE FOR ANTENNA, ANTENNA PACKAGE AND IMAGE DISPLAY DEVICE

CROSS-REFERENCE TO RELATED APPLICATION

This application claims priority to Korean Patent Applications No. 10-2021-0021695 filed on Feb. 18, 2021 and No. 10-2021-0026098 filed on Feb. 26, 2021 in the Korean Intellectual Property Office (KIPO), the entire disclosures of which are incorporated by reference herein.

BACKGROUND

1. Field

The present invention relates to a connector for an antenna, an antenna package and an image display device including the same.

2. Description of the Related Art

As information technologies have been developed, a wireless communication technology such as Wi-Fi, Bluetooth, etc., is combined with an image display device in, e.g., a smartphone form. In this case, an antenna may be combined with the image display device to provide a communication function.

According to developments of a mobile communication technology, an antenna capable of implementing, e.g., high frequency or ultra-high frequency band communication is needed in the image display device.

The antenna may transmit and receive signals of a plurality of different frequency bands. To connect the antenna to a driving circuit, a connection structure of a plurality of circuit boards may be included in an antenna package.

However, when the antennas having different frequencies are included in one package, spatial efficiency may be degraded due to a complexity in a wiring connection structure and an antenna arrangement structure. Additionally, a mutual signal interference by the antennas and the connection structure may also be caused.

Thus, construction of an antenna package having improved spatial efficiency while transmitting and receiving signals of the plurality of frequency bands is required.

For example, Korean Published Patent Application No. 2013-0095451 discloses an antenna integrated into a display panel, but does not suggest the efficient antenna arrangement and circuit connection as described above.

SUMMARY

According to an aspect of the present invention, there is provided a connector structure for an antenna having improved electrical reliability and spatial efficiency.

According to an aspect of the present invention, there is provided an antenna package having improved electrical reliability and spatial efficiency.

According to an aspect of the present invention, there is provided an image display device including an antenna package with improved electrical reliability and spatial efficiency.

(1) A connector structure for an antenna, including: a second connector; and a first connector coupled to the second connector, the first connector including: a first insulator; a first conductive connection terminal disposed on the first insulator; a second conductive connection terminal spaced apart from the first conductive connection terminal to form a single row structure on the first insulator together with the first conductive connection terminal; and a first barrier structure disposed between the first conductive connection terminal and the second conductive connection terminal on the first insulator.

(2) The connector structure for an antenna of the above (1), wherein the second connector includes: a second insulator; a third conductive connection terminal arranged on the second insulator and electrically connected to the first conductive connection terminal; and a fourth conductive connection terminal disposed on the second insulator to be spaced apart from the third conductive connection terminal and electrically connected to the second conductive connection terminal.

(3) The connector structure for an antenna of the above (2), wherein the third conductive connection terminal and the fourth conductive connection terminal form a single row structure in the second connector.

(4) The connector structure for an antenna of the above (2), wherein the second connector further includes a second barrier structure disposed on the second insulator between the third conductive connection terminal and the fourth conductive connection terminal.

(5) The connector structure for an antenna of the above (2), wherein the second connector further includes a second barrier structure disposed on each of both end portions in a length direction of the second insulator.

(6) An antenna package, including: an antenna device including a first antenna unit and a second antenna unit physically separated from each other; a first circuit board electrically connected to the first antenna unit and the second antenna unit; and a first connector mounted on the first circuit board and electrically connected to the first antenna unit and the second antenna unit, wherein the first connector includes: a first conductive connection terminal electrically connected to the first antenna unit; a second conductive connection terminal electrically connected to the second antenna unit; and a first barrier structure disposed between the first conductive connection terminal and the second conductive connection terminal.

(7) The antenna package of the above (6), wherein the first antenna unit includes a first radiator, the second antenna unit includes a second radiator, and the first radiator and the second radiator have different sizes from each other.

(8) The antenna package of the above (7), wherein the first antenna unit and the second antenna unit have different resonance frequencies from each other.

(9) The antenna package of the above (6), wherein a plurality of the first antenna unit and a plurality of the second antenna unit are arranged in the antenna device in an array from; a plurality of the first conductive connection terminal is each electrically connected to each of the plurality of the first antenna unit; and a plurality of the second conductive connection terminal is each electrically connected to each of the plurality of the second antenna unit.

(10) The antenna package of the above (9), wherein the first circuit board includes: first signal wirings, each of which is bonded to each of the plurality of the first antenna unit and electrically connected to each of the plurality of the first conductive connection terminal; and second signal wirings, each of which is bonded to the plurality of the second antenna unit and electrically connected to each of the plurality of the second conductive connection terminal.

(11) The antenna package of the above (6), further including: a second circuit board including a connection wiring; a second connector mounted on the second circuit board and coupled to the first connector; and an antenna driving integrated circuit chip mounted on the second circuit board and electrically connected to the second connector through the connection wiring.

(12) The antenna package of the above (11), wherein the second connector includes: a third conductive connection terminal electrically connected to the first conductive connection terminal; a fourth conductive connection terminal electrically connected to the second conductive connection terminal; and a second barrier structure disposed between the third conductive connection terminal and the fourth conductive connection terminal.

(13) The antenna package of the above (12), wherein a plurality of the first conductive connection terminal and a plurality of the second conductive connection terminal form a single row structure in the first connector; and a plurality of the third conductive connection terminal and a plurality of the fourth conductive connection terminal form a single row structure in the second connector.

(14) The antenna package of the above (12), wherein the antenna device further includes an antenna dielectric layer on which the first antenna unit and the second antenna unit are disposed, wherein the antenna device includes a first radiation group including a plurality of the first antenna unit adjacent to each other along a width direction on the antenna dielectric layer; and a second radiation group including a plurality of the second antenna unit adjacent to each other in the width direction on the antenna dielectric layer.

(15) The antenna package of the above (14), wherein the first connector includes a first terminal group including a plurality of the first conductive connection terminal adjacent to each other to be electrically connected to the first radiation group; and a second terminal group including a plurality of the second conductive connection terminal adjacent to each other to be electrically connected to the second radiation group; wherein the second connector includes a third terminal group including a plurality of the third conductive connection terminal adjacent to each other to be electrically connected to the first terminal group; and a fourth terminal group including a plurality of the fourth conductive connection terminal adjacent to each other to be electrically connected to the second terminal group.

(16) The antenna package of the above (15), wherein the first barrier structure is disposed between the first terminal group and the second terminal group, and the second barrier structure is disposed between the third terminal group and the fourth terminal group.

(17) The antenna package of the above (6), wherein the first circuit board includes a third signal wiring electrically separated from the first antenna unit and the second antenna unit and electrically connected to the first barrier structure.

(18) The antenna package of the above (17), wherein the antenna device further includes a first ground pad adjacent to the first antenna unit and a second ground pad adjacent to the second antenna unit, and at least one of the first ground pad and the second ground pad is connected to the third signal wiring.

(19) The antenna package of the above (6), wherein the antenna device further includes an antenna dielectric layer on which the first antenna unit and the second antenna unit are disposed, and wherein the first antenna unit and the second antenna unit are alternately and repeatedly arranged along a width direction on the antenna dielectric layer.

(20) An image display device, including: a display panel; and the antenna package according to embodiments as described above disposed on the display panel.

According to embodiments of the present invention, the antenna device may include a first antenna unit and a second antenna unit having different resonance frequencies from each other. Accordingly, one antenna device may be provided as a multi-radiation or multi-band antenna capable of radiating in a plurality of resonance frequency bands.

In exemplary embodiments, a first circuit board bonded to the antenna device and a second circuit board on which an antenna driving integrated circuit chip is mounted may be electrically connected through a connector structure. The connector structure may include a single row of conductive connection terminals. Accordingly, a current and signal path through the first and second circuit boards may be formed in a single direction, thereby improving signal efficiency by a current concentration and a signal loss may be reduced.

According to exemplary embodiments, the connector structure may include a first conductive connection terminal electrically connected to the first antenna unit, a second conductive connection terminal electrically connected to the second antenna unit, and a barrier structure disposed between the first conductive connection terminal and the second conductive terminal. Accordingly, interference and disturbance between different signals within the connector structure may be prevented, so that antenna gain properties may be improved.

Further, a shielding effect may be provided by the barrier structure, so that reliability of signal transmission and reception from a single connector structure to the antenna device having the plurality of resonance frequencies may be improved. Accordingly, a mismatch that may be caused when a plurality of connector structures may be employed may be reduced or removed to improve a spatial efficiency of the antenna package.

DETAILED DESCRIPTION

According to exemplary embodiments of the present invention, there is provided a connector structure for an antenna, and an antenna package including a connection of an antenna device and a connector structure. Further, there is provided an image display device including the antenna package.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Figure 1:
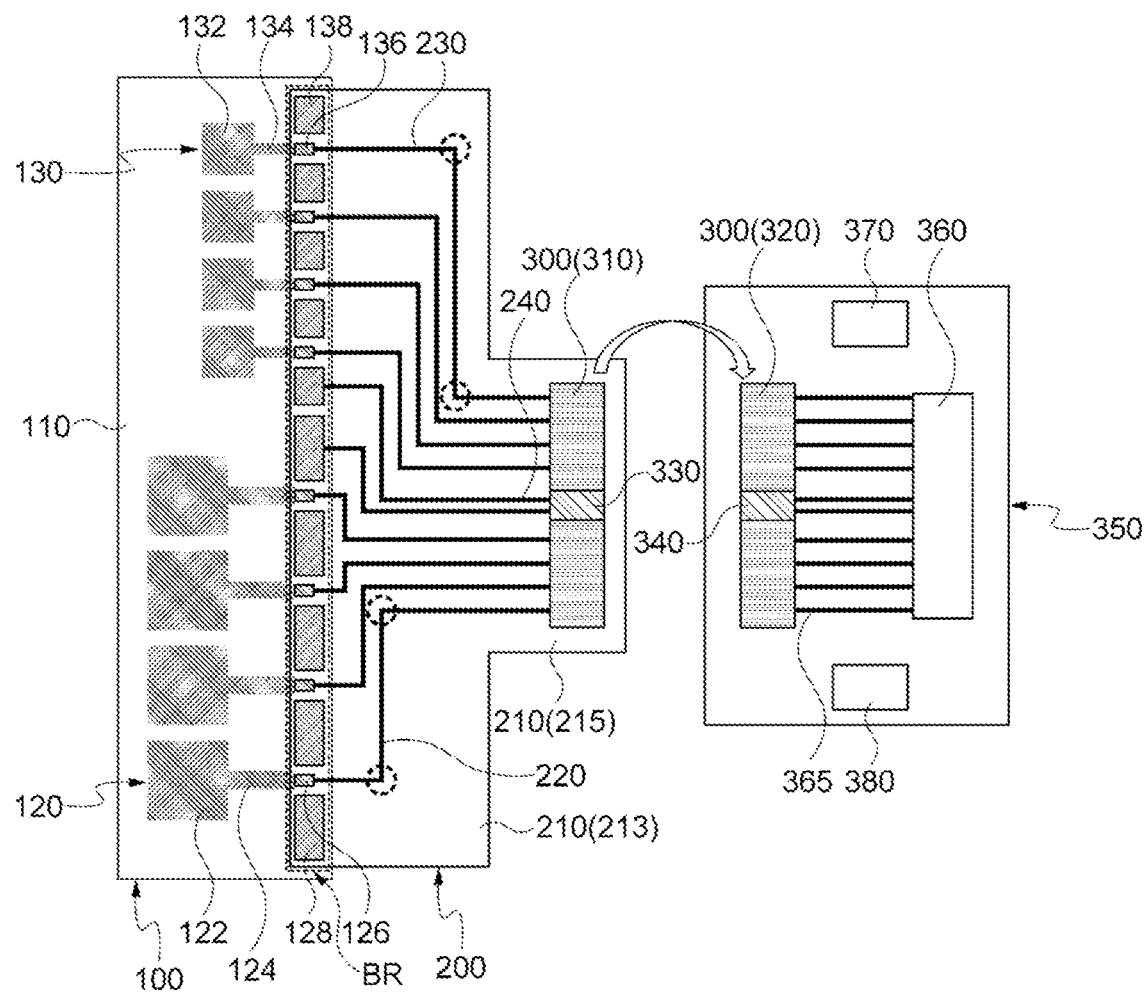
FIG. 1 is a schematic top planar view illustrating an antenna package in accordance with exemplary embodiments.

FIG. 1 is a schematic top planar view illustrating an antenna package in accordance with exemplary embodiments.

Referring to FIG. 1, the antenna package may include an antenna device 100, a first circuit board 200 and a connector structure 300. The antenna package may further include a second circuit board 350 connected to the first circuit board 200 through a connector structure 300.

The antenna device 100 may include an antenna dielectric layer 110, and a first antenna unit 120 and a second antenna unit 130 physically and electrically separated from each other on the antenna dielectric layer 110.

The antenna dielectric layer 110 may include a polyester-based resin such as polyethylene terephthalate, polyethylene isophthalate, polyethylene naphthalate and polybutylene terephthalate; a cellulose-based resin such as diacetyl cellulose and triacetyl cellulose; a polycarbonate-based resin; an acrylic resin such as polymethyl (meth)acrylate and polyethyl (meth)acrylate; a styrene-based resin such as polystyrene and an acrylonitrile-styrene copolymer; a polyolefin-based resin such as polyethylene, polypropylene, a cycloolefin or polyolefin having a norbornene structure and an ethylene-propylene copolymer; a vinyl chloride-based resin; an amide-based resin such as nylon and an aromatic polyamide; an imide-based resin; a polyethersulfone-based resin; a sulfone-based resin; a polyether ether ketone-based resin; a polyphenylene sulfide resin; a vinyl alcohol-based resin; a vinylidene chloride-based resin; a vinyl butyral-based resin; an allylate-based resin; a polyoxymethylene-based resin; an epoxy-based resin; a urethane or acrylic urethane-based resin; a silicone-based resin, etc. These may be used alone or in a combination of two or more therefrom.

In some embodiments, an adhesive film such as an optically clear adhesive (OCA) or an optically clear resin (OCR) may be included in the antenna dielectric layer 110. In some embodiments, the antenna dielectric layer 110 may include an inorganic insulating material such as silicon oxide, silicon nitride, silicon oxynitride, glass, or the like.

In some embodiments, a dielectric constant of the antenna dielectric layer 110 may be adjusted in a range from about 1.5 to about 12. When the dielectric constant exceeds about 12, a driving frequency may be excessively decreased, so that driving in a desired high or ultra-high frequency band may not be implemented.

The first antenna unit 120 and the second antenna unit 130 may be formed on a top surface of the antenna dielectric layer 110.

For example, a plurality of the first antenna units 120 may be disposed in an array form along a width direction of the antenna dielectric layer 110 or the antenna device to form a first antenna unit row, and a plurality of the second antenna units 130 may be disposed in an array form along the width direction of the antenna dielectric layer 110 or the antenna device to form a second antenna unit row.

In exemplary embodiments, the first antenna unit 120 may include a first radiator 122 and a first transmission line 124, and the second antenna unit 130 may include a second radiator 132 and a second transmission line 134.

The first radiator 122 and the second radiator 132 may have, e.g., a polygonal plate shape, and the first transmission line 124 and the second transmission line 134 may extend from a side of the first radiator 122 and the second radiator 132, respectively. The first transmission line 124 and the second transmission line 134 may be formed as a single member substantially integral with the first radiator 122 and the second radiator 132, respectively, and may have a narrower width than that of the first radiator 122 and the second radiator 132, respectively.

The first antenna unit 120 may further include a first signal pad 126, and the second antenna unit 130 may further include a second signal pad 136. The first signal pad 126 may be connected to an end portion of the first transmission line 124, and the second signal pad 136 may be connected to an and portion of the second transmission line 134.

In an embodiment, the first signal pad 126 may serve as a member substantially integral with the first transmission line 124, and the end portion of the first transmission line 124 may serve as the first signal pad 126.

In an embodiment, the second signal pad 136 may serve as a member substantially integral with the second transmission line 134, and the end portion of the second transmission line 134 may serve as the second signal pad 136.

In some embodiments, the antenna device 100 may include first ground pads 128 disposed to be adjacent to the first antenna units 120 and second ground pads 138 disposed to be adjacent to the second antenna units 130.

For example, first ground pads 128 may be disposed around the first signal pad 126, and second ground pads 138 may be disposed around the second signal pad 136. For example, the first ground pad 128 may be electrically and physically separated/spaced apart from the first transmission line 124 and the first signal pad 126. For example, the second ground pad 138 may be electrically and physically separated/spaced apart from the second transmission line 134 and the second signal pad 136.

The antenna units 120 and 130 or the radiators 122 and 132 may be designed to have, e.g., a resonance frequency of high frequency or ultra-high frequency band corresponding to 3G, 4G, 5G or higher band. For example, the resonance frequency of the antenna unit may be 10 GHz or more, or in a range from about 20 to 40 GHz.

In exemplary embodiments, the first radiator 122 and the second radiator 132 having different sizes from each other may be arranged on the antenna dielectric layer 110. For example, the first radiator 122 and the second radiator 132 may have different resonance frequencies. In this case, the antenna device 100 may serve as a multi-radiation or multi-band antenna radiating in a plurality of resonance frequency bands.

The antenna units 120 and 130 and the ground pads 128 and 138 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca) or an alloy containing at least one of the metals. These may be used alone or in combination thereof.

In an embodiment, the antenna units 120 and 130 and the ground pads 128 and 138 may include silver (Ag) or a silver alloy (e.g., silver-palladium-copper (APC)), or copper (Cu) or a copper alloy (e.g., a copper-calcium (CuCa)) to implement a low resistance and a fine line width pattern.

In some embodiments, the antenna units 120 and 130 and the ground pads 128 and 138 may include a transparent conductive oxide such as indium tin oxide (ITO), indium zinc oxide (IZO), zinc oxide (ZnOx), indium zinc tin oxide (IZTO), etc.

In some embodiments, the antenna units 120 and 130 and the ground pads 128 and 138 may include a stacked structure of a transparent conductive oxide layer and a metal layer. For example, the antenna units 120 and 130 and the ground pads 128 and 138 may include a double-layered structure of a transparent conductive oxide layer-metal layer, or a triple-layered structure of a transparent conductive oxide layer-metal layer-transparent conductive oxide layer. In this case, flexible property may be improved by the metal layer, and a signal transmission speed may also be improved by a low resistance of the metal layer. Corrosive resistance and transparency may be improved by the transparent conductive oxide layer.

In an embodiment, the antenna units 120 and 130 may include a blackened portion, so that a reflectance at a surface of the antenna units 120 and 130 may be decreased to suppress a visual recognition of the antenna unit due to a light reflectance.

In an embodiment, a surface of the metal layer included in the antenna units 120 and 130 may be converted into a metal oxide or a metal sulfide to form a blackened layer. In an embodiment, a blackened layer such as a black material coating layer or a plating layer may be formed on the antenna units 120 and 130 or the metal layer. The black material or plating layer may include silicon, carbon, copper, molybdenum, tin, chromium, molybdenum, nickel, cobalt, or an oxide, sulfide or alloy containing at least one therefrom.

A composition and a thickness of the blackened layer may be adjusted in consideration of a reflectance reduction effect and an antenna radiation property.

In some embodiments, the radiators 122 and 132 and the transmission lines 124 and 134 may include a mesh-pattern structure to improve a transmittance. In this case, a dummy mesh pattern (not illustrated) may be formed around the radiators 122 and 132 and the transmission lines 124 and 134.

The signal pads 126 and 136 and the ground pads 128 and 138 may be formed as a solid pattern formed of the above-described metal or alloy in consideration of a reduction of a feeding resistance, a noise absorption efficiency, an improvement of horizontal radiation properties, etc.

In an embodiment, the radiators 122 and 132 may have a mesh-pattern structure, and at least portions of the transmission lines 124 and 134 may include a solid metal pattern.

The radiators 122 and 132 may be disposed in a display area of an image display device, and the signal pads 126 and 136 and the ground pads 128 and 138 may be disposed in a non-display area or a bezel area of the image display device. At least portions of the transmission lines 124 and 134 may also be disposed in the non-display area or the bezel area.

The first circuit board 200 may include a core layer 210 and a first signal wiring 220 and a second signal wiring 230 formed on the surface of the core layer 210. For example, the first circuit board 200 may be a flexible printed circuit board (FPCB).

In some embodiments, the antenna dielectric layer 110 may serve as the first circuit board 200. In this case, the first circuit board 200 (e.g., the core layer 210 of the first circuit board 200) may be provided as a member substantially integral with the antenna dielectric layer 110. Further, the first and second signal wirings 220 and 230 to be described later may be directly connected to the first and second transmission lines 124 and 134, respectively, and the signal pads 126 and 136 may be omitted.

The core layer 210 may include, e.g., a flexible resin such as a polyimide resin, a modified polyimide (MPI), an epoxy resin, polyester, a cycloolefin polymer (COP) or a liquid crystal polymer (LCP). The core layer 210 may include an internal insulating layer included in the first circuit board 200.

The first and second signal wirings 220 and 230 may serve as, e.g., feeding lines. The first and second signal wirings 220 and 230 may be arranged on one surface (e.g., a surface facing the antenna units 120 and 130) of the core layer 210.

For example, the first circuit board 200 may further include a coverlay film formed on the one surface of the core layer 210 and covering the first and second signal wirings 220 and 230.

The first signal wirings 220 may be connected to or bonded to the first signal pads 126 of the first antenna units 120, and the second signal wirings 230 may be connected or bonded to the signal pads 136 of the second antenna units 130.

For example, the coverlay film of the first circuit board 200 may be partially removed to expose one end portions of the first signal wiring 220 and the second signal wiring 230. The exposed end portions of the first signal wiring 220 and the second signal wiring 230 may be bonded to the first signal pad 126 and the second signal pad 136, respectively.

For example, a conductive bonding structure such as an anisotropic conductive film (ACF) may be attached on the signal pads 126 and 136 and/or the ground pads, and a bonding region BR of the first circuit board 200 in which the end portions of the first and second signal wirings 220 and 230 are located may be disposed on the conductive bonding structure. Thereafter, the bonding region BR of the first circuit board 200 may be attached to the antenna device 100 through a heat treatment/pressurization process.

For example, the first signal wiring 220 and the second signal wiring 230 may be electrically connected to the first signal pad 126 and the second signal pad 136, respectively.

As illustrated in FIG. 1, the first signal wirings 220 may be independently connected or bonded to each of the first signal pads 126 of the first antenna units 120, and the second signal wirings 230 may be independently connected or bonded to each of the second signal pads 136 of the second antenna units 130. In this case, feeding and control signals may be independently supplied from an antenna driving integrated circuit (IC) chip 360 to each of the antenna units 120 and 130.

In some embodiments, the predetermined number of the first antenna units 120 may be coupled through the first signal wirings 220, and the predetermined number of second antenna units 130 may be coupled through the second signal wirings 230.

In some embodiments, the first circuit board 200 or the core layer 210 may include a first portion 213 and a second portion 215 having different widths from each other, and the second portion 215 may have a width smaller than that of the first portion 213.

The first portion 213 may serve as, e.g., a main substrate portion of the first circuit board 200. One end of the first portion 213 may include the bonding area BR, and the first and second signal wirings 220 and 230 may extend on the first portion 213 from the bonding region BR to the second portion 215.

The first and second signal wirings 220 and 230 may include bent portions on the first portion 213 as indicated by dotted circles. Accordingly, the first and second signal wirings 220 and 230 may extend on the second portion 215 having a relatively narrow width with a smaller spacing or a higher wiring density than that in the first portion 213.

The second portion 215 may serve as a connector-coupling portion. For example, the second portion 215 may be bent toward a rear portion of the image display device to be electrically connected to a second circuit board 350. Accordingly, a circuit connection of the first and second signal wirings 220 and 230 may be easily implemented by using the second portion 215 having the reduced width.

Additionally, bonding stability between the first circuit board 200 and the antenna device 100 may be improved by the first portion 213 having a large width. In an array of the antenna units 120 and 130 of the antenna device 100, a sufficient distribution space for the first and second signal wirings 220 and 230 may be provided by the first portion 213.

In exemplary embodiments, the first circuit board 200 and the second circuit board 350 may be electrically connected to each other through a connector structure 300.

In some embodiments, the connector structure 300 may serve as a Board to Board (B2B) connector, and may include a first connector 310 mounted on the first circuit board 200 and a second connector 320 mounted on the second circuit board 350 to be coupled to the first connector 310.

For example, the first connector 310 may surface mounted on the second portion 215 of the first circuit board 200 to be electrically connected to terminal end portions of the first and second signal wirings 220 and 230 through a surface mounting technology (SMT).

The second circuit board 350 may be, e.g., a main board of the image display device, and may be a rigid printed circuit board. For example, the second circuit board 350 may include a resin (e.g., an epoxy resin) layer impregnated with an inorganic material such as glass fiber (e.g., such as a prepreg) as a base insulating layer, and may include circuit wirings distributed on a surface and at an inside of the base insulating layer.

The antenna driving IC chip 360 may be mounted on the second circuit board 350. As described above, the second connector 320 may be mounted on the second circuit board 350 through, e.g., the SMT. For example, the second connector 320 may be electrically connected to the antenna driving IC chip 360 through a connection wiring 365 formed on one surface of the second circuit board 350.

As indicated by an arrow in FIG. 1, the first connector 310 mounted on the first circuit board 200 and the second connector 320 mounted on the second circuit board 350 may be coupled to each other. For example, the first connector 310 may be provided as a plug connector or a male connector, and the second connector 320 may be provided as a receptacle connector or a female connector.

Accordingly, the connection of the first and second circuit boards 200 and 350 may be implemented through the connector structure 300, and the electrical connection between the antenna driving IC chip 360 and the antenna units 120 and 130 may also be implemented. Thus, feeding/control signal (e.g., a phase signal, a beam tilting signal, etc.) may be applied from the antenna driving IC chip 360 to the antenna units 120 and 130. Further, an intermediate structure of the first circuit board 200—the connector structure 300—the second circuit board 350 may be formed.

As described above, the first and second circuit boards 200 and 350 may be electrically connected to each other using the connector structure 300. Accordingly, the first and second circuit boards 200 and 350 may be easily coupled to each other by using the connector structure 300 without an additional bonding process including a heating/pressing process.

Therefore, a dielectric loss due to thermal damages and a resistance increase due to wiring damage caused by the heating and pressing process may be suppressed to prevent a signal loss in the antenna units 120 and 130.

Further, the second portion 215 of the first circuit board 200 on which the first connector 310 is mounted may be bent such that the first connector 310 may be combined with the second connector 320. Thus, the connection to the second circuit board 350 disposed at the rear portion of the image display apparatus may be easily implemented.

A circuit device 370 and a control device 380 may be further mounted on one surface of the second circuit board 350. The circuit device 370 may include, e.g., a capacitor such as a multilayer ceramic capacitor (MLCC), an inductor, a resistor, or the like. The control device 380 may include, e.g., a touch sensor driving IC chip, a radio frequency IC (RFIC) connected to an application processor (AP) chip, or the like. For example, the RFIC may receive a high-frequency signal and modulate the signal into a low-frequency band operable by a communication modem, or may modulate a low-frequency signal into a high-frequency signal.

Figure 2:
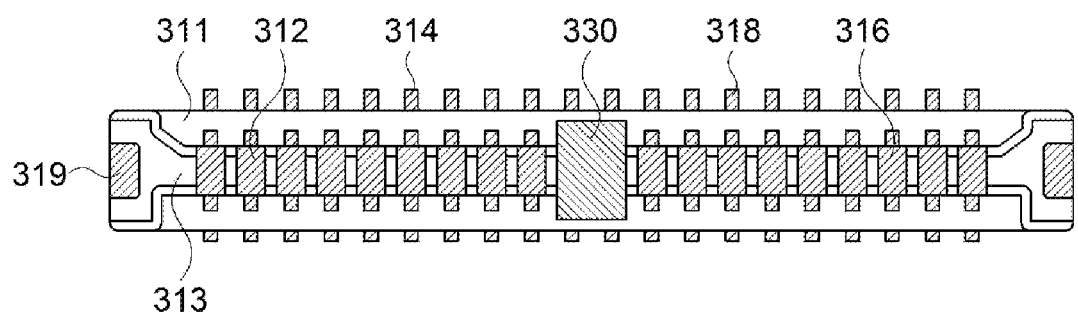
FIGS. 2 and 3 are a top planar view and a side view illustrating a connector structure included in an antenna package in accordance with exemplary embodiments.
Figure 2:
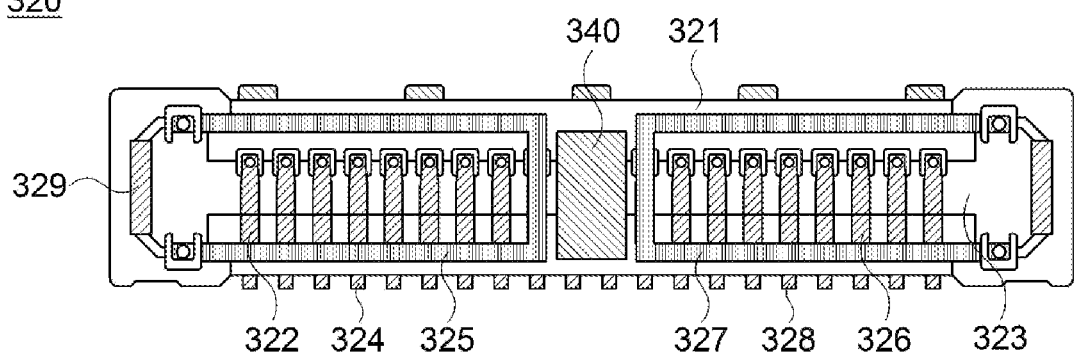
Figure 3:
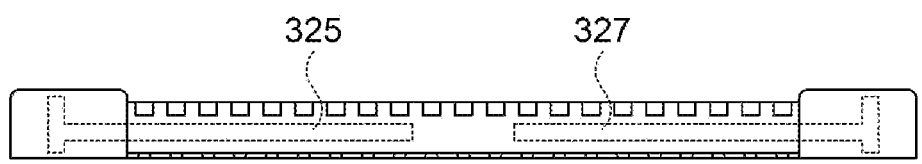

FIGS. 2 and 3 are a top planar view and a side view illustrating a connector structure included in an antenna package in accordance with exemplary embodiments. Specifically, FIG. 2 is a top planar view illustrating constructions of the first connector 310 and the second connector 320, and FIG. 3 a side view schematically illustrating a projection of a third barrier structure 325 and a fourth barrier structure 327.

Referring to FIG. 2, each of the first connector 310 and the second connector 320 may include conductive connection terminals.

For example, the first connector 310 may include a first insulator 311, a first conductive connection terminal 312 electrically connected to the first antenna unit 120, and a second conductive connection terminal 316 electrically connected to the second antenna unit 130.

For example, the first insulator 311 may be provided as a substrate of the first conductive connection terminal 312 and the second conductive connection terminal 316. The first insulator 311 may include an insulating protrusion 313.

The first connector 310 may include a first connection lead 314 connected to the first conductive connection terminal 312 and exposed to an outside of the first insulator 311, and a second connection lead 318 connected to the second conductive connection terminal 316 and exposed to the outside of the insulator 311.

In some embodiments, a plurality of the first conductive connection terminals 312 may be arranged to be electrically connected to each of the plurality of first antenna units 120, and a plurality of the second conductive connection terminals 316 may be arranged electrically connected to each of the plurality of second antenna units 130.

For example, the first connection leads 314 may extend from each of the first conductive connection terminals 312, and the first connection leads 314 may correspond to each of the first signal pads 126 included in the plurality of the first antenna units 120.

For example, the second connection leads 318 may extend from each of the second conductive connection terminals 316, and the second connection leads 318 may correspond to each of the second signal pads 136 included in the plurality of the second antenna units 130.

In exemplary embodiments, the first connector 310 may include a first barrier structure 330 disposed between the first conductive connection terminal 312 and the second conductive connection terminal 316. In this case, the first conductive connection terminal 312 and the second conductive connection terminal 316 respectively connected to the first antenna unit 120 and the second antenna unit 130 having different resonant frequencies, respectively, may be shielded from each other by the first barrier structure 330. Accordingly, interference or disturbance between signals transmitted to and received from the first antenna unit 120 and the second antenna unit 130 having different resonance frequencies may be prevented.

In some embodiments, a first side barrier structures 319 may be disposed at each of both end portions of the first connector 310 in a width direction. In this case, an external noise from the width direction of the first connector 310 may be shielded, and signal loss and disturbance may be prevented. Accordingly, an antenna gain from the first and second antenna units 120 and 130 may be improved.

The second connector 320 may include a second insulator 321, a third conductive connection terminal 322 electrically connected to the first conductive connection terminal 312, and a fourth conductive connection terminal 326 electrically connected to the second conductive connection terminal 316.

For example, the second insulator 321 may serve as a substrate of the third conductive connection terminal 322 and the fourth conductive connection terminal 326. The second insulator 321 may include a recess 323.

In some embodiments, a plurality of the third conductive connection terminals 322 may be arranged to be electrically connected to each of the plurality of first conductive connection terminals 312, and a plurality of the fourth conductive connection terminals 326 may be arranged to be electrically connected to each of the plurality of the second conductive connection terminals 316.

The second connector 320 may include third connection leads 324 connected to each of the plurality of the third conductive connection terminals 322 and exposed to an outside of the second insulator 321, and fourth connection leads 328 connected to each of the plurality of the fourth conductive connection terminals 326 and exposed to an outside of the second insulator 321.

For example, the third connection leads 324 and the fourth connection leads 328 may correspond to each of the connection wiring 365 formed on one surface of the second circuit board 350.

In exemplary embodiments, the second connector 320 may include a second barrier structure 340 disposed between the third conductive connection terminal 322 and the fourth conductive connection terminal 326. In this case, the third conductive connection terminal 322 and the fourth conductive connection terminal 326 connected to the first conductive connection terminal 312 and the second conductive connection terminal 316 for transmitting and receiving different signals, respectively, may be electrically and physically separated from each other.

Accordingly, interference or loss between signals transmitted to and received from the first antenna unit 120 and the second antenna unit 130 having different resonance frequencies may be prevented when combining the first connector 310 and second connector 320 together with the first barrier structure 330.

In some embodiments, a second side barrier structure 329 may be disposed at each of both end portions of the second connector 320 in the width direction. Accordingly, when the first connector 310 and the second connector 320 are coupled to each other, the first side barrier structure 319 and the second side barrier structure 329 may be combined to reduce the external noise from the width direction of the connector structure 300 and prevent the signal loss.

In an embodiment, the insulators 311 and 321 may include an insulating material having a permittivity (Dk, or dielectric constant) in a range from 2 to 3.5, and a loss tangent (Df, or dielectric loss) in a range of 0.0015 to 0.007.

Within the above range, in, e.g., a communication band of a high-frequency or ultra-high frequency range of 20 GHz or more, signal loss and gain reduction in the connector structure 300 may be prevented, and sufficient radiation properties from the antenna units 120 and 130 may be obtained.

In some embodiments, the insulators 311 and 321 may include a liquid crystal polymer (LCP) structure, a polyphenylene sulfide (PPS) structure and/or a modified polyimide (MPI) structure.

For example, each of the first connector 310 and the second connector 320 may include double-row conductive connection terminals. However, the double-row structure may cause current and signal flow to be dispersed in a bi-directional path. Accordingly, collision between separated signal paths may occur, and gain and directivity of an antenna radiation may also be deteriorated due to the current dispersion.

Thus, according to some exemplary embodiments, the first conductive connection terminals 312, the second conductive connection terminals 316, the third conductive connection terminals 322 and the fourth conductive connection terminals 326 may each arranged to form a pad row in a single row structure or a mono-row structure.

For example, the first conductive connection terminals 312 and the second conductive connection terminals 316 may be repeatedly spaced apart from each other on the insulating protrusion 313 to form a first pad row having the single row structure or the mono-row structure.

For example, the third conductive connection terminals 322 and the fourth conductive connection terminals 326 may be repeatedly spaced apart from each other on a bottom surface of the recess 323 to form a second pad row having the single row structure or the mono-row structure.

According to the embodiments using the connector structure 300 including the conductive connection terminals 312, 316, 322 and 326 arranged in the single row structure as described above, the single pad row may be employed to unify a direction of current flow and signal path. Accordingly, an antenna radiation directivity may be improved and radiation properties of a desired high frequency or ultra-high frequency band may be implemented with high reliability.

As illustrate in FIG. 1, in some embodiments, a plurality of the first antenna units 120 may disposed to be adjacent to each other along the width direction on the antenna dielectric layer 110 to form a first radiation group, and a plurality of the second antenna units 130 may be disposed to be adjacent to each other in the width direction along the width direction on the antenna dielectric layer 110 to form a second radiation group.

The first connector 310 may include a first terminal group formed by the plurality of the first conductive connection terminals 312 arranged to be adjacent to each other and to be electrically connected to the first radiation group, and a second terminal group formed by the plurality of the second conductive connection terminals 316 arranged to be adjacent to each other and to be electrically connected to the second radiation group.

The second connector 320 may include a third terminal group formed by the plurality of the third conductive connection terminals 322 arranged to be adjacent to each other and to be electrically connected to the first terminal group, and a fourth terminal group formed by the fourth conductive connection terminals 326 arranged to be adjacent to each other and to be electrically connected to the second terminal group.

For example, the first barrier structure 330 may be interposed between the first terminal group and the second terminal group, and the second barrier structure 340 may be interposed between the third terminal group and the fourth terminal group. Accordingly, interference or disturbance between different signals transmitted to or received from the first antenna unit 120 and the second antenna unit 130 having different resonance frequencies may be prevented.

In some embodiments, the first circuit board 200 may further include a third signal wiring 240. The third signal wiring 240 may be electrically and physically separated from the first antenna units 120 and the second antenna units 130, and may be electrically connected to the first barrier structure 330 of the first connector 310.

For example, as illustrated in FIG. 1, the third signal wiring 240 may be connected to at least one of the above-described first ground pad 128 and the second ground pad 138. Accordingly, noise shielding and signal interference prevention may be simultaneously implemented by the first and second ground pads 128 and 138 and the first barrier structure 330. Thus, signal interference or signal loss between different signals transmitted to or received from the first antenna unit 120 and the second antenna unit 130 having different resonance frequencies may be prevented, and radiation properties may be improved.

For example, one end portion of the third signal wiring 240 may be exposed by partially removing the coverlay film of the first circuit board 200. The exposed one end portion of the third signal wiring 240 may be bonded to at least one of the first ground pad 128 and the second ground pad 138.

For example, the third signal wiring 240 may also include a bent portion.

In some embodiments, the second connector 320 may include a third barrier structure 325 spaced apart from the third terminal group and at least partially surrounding the third terminal group, and a fourth barrier structure 327 spaced apart from the fourth terminal group and at least partially surrounding the fourth terminal group.

For example, the third barrier structure 325 may have a shape extending to surround both end portions of the third terminal group in a length direction and an end portion of the third terminal group in the width direction adjacent to the second barrier structure 340 (e.g., surrounding three sides of the third terminal group).

For example, the fourth barrier structure 327 may have a shape extending to surround both end portions of the fourth terminal group in the length direction and an end portion of the fourth terminal group in the width direction adjacent to the second barrier structure 340 (e.g., surrounding three sides of the fourth terminal group).

In this case, a signal loss that may occur at end portions of the connector structure 300 may be prevented and the external noise shielding effect may be enhanced with a combination of the second side barrier structure 329. Accordingly, signal efficiency may be increased to improve the antenna gain. For example, when the first connector 310 and the second connector 320 are coupled to each other, the first side barrier structure 319, the second side barrier structure 329 and the barrier structures 325, 327, 330 and 340 may implement the above-described shielding effect together.

Referring to FIG. 3, the third barrier structure 325 and the fourth barrier structure 327 may extend at an inside of the second connector 320. For example, one end portions of the third barrier structure 325 and the fourth barrier structure 327 may extend in a vertical direction of the second connector 320 to be combined with the second connector 320.

FIGS. 2 and 3 illustrate embodiments in which the first connector 310 serves as a male connector and the second connector 320 serves as a female connector. In this case, as described above, the third and fourth barrier structures 325 and 327 may be formed in the second connector 320.

In some embodiments, the first connector 310 may serve as a female connector, and the second connector 320 may serve as a male connector. In this case, the third and fourth barrier structures 325 and 327 may be formed in the first connector 310. For example, the third barrier structure 325 may be spaced apart from the first terminal group to at least partially surround the first terminal group, and the fourth barrier structure 327 may be spaced apart from the second terminal group to at least partially surround the second terminal group.

As described above, construction and arrangement of the connectors in the connector structure may be properly modified in consideration of convenience of process and antenna operation.

Figure 4:
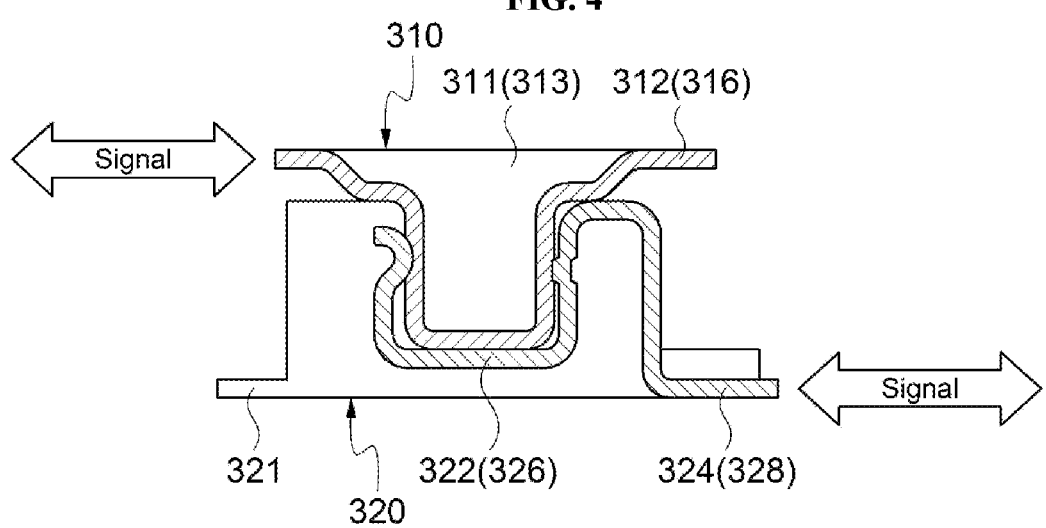
FIG. 4 is a schematic cross-sectional view illustrating a signal transfer through a connector structure in accordance with exemplary embodiments.

FIG. 4 is a schematic cross-sectional view illustrating a signal transfer through a connector structure in accordance with exemplary embodiments.

Referring to FIG. 4, as described with reference to FIG. 1, the first connector 310 and the second connector 320 may be coupled to each other so that the intermediate structure of the first circuit board 200—the connector structure 300—the second circuit board 350 may be formed.

The first and second conductive connection terminals 312 and 316 included in the first connector 310 may serve as plugs, and the third and fourth conductive connection terminals 322 and 326 included in the second connector 320 may serve as landing pads, respectively. Accordingly, the first conductive connection terminal 312 may be physically and electrically coupled to the third conductive connection terminal 322, and the second conductive connection terminal 316 may be physically and electrically connected to the fourth conductive connection terminal 326.

As described above, the conductive connection terminals 312, 316, 322 and 326 may each form a pad row having a single row structure.

Accordingly, current or signal flow through the connector structure 300 may become uniform in one direction between the first circuit board 200 and the second circuit board 350 as indicated by "signal" in FIG. 4.

Input/output of current and signal may be unified in one direction, so that impedance mismatch and signal loss due to distortion or interference of current and signal paths may be reduced or suppressed.

Additionally, a path of power and control signal from the antenna driving IC chip 360 may be shortened and a directivity of the signal may be unified, so that signal loss occurring in high frequency or ultra-high frequency communication band may be efficiently prevented.

In some embodiments, the first connector 310 and the second connector 320 may be coupled such that the first barrier structure 330 and the second barrier structure 340 contact each other. In this case, signal interference or signal disturbance between the first and third conductive connection terminals 312 and 322 for a signaling with the first antenna unit 120 and the second and fourth conductive connection terminals 316 and 326 for a signaling with the second antenna unit 130 may be blocked. Accordingly, radiation properties and signal efficiency of the antenna device 100 having a plurality of resonance frequencies may be improved.

For example, the antenna units 120 and 130 having different resonance frequencies may be connected together via the single connector structure 300. For example, the first antenna unit 120 and the second antenna unit 130 may be electrically connected to each other via one connector structure 300 while preventing the signal interference and signal loss by the first and second barrier structures 330 and 340. In this case, the single connector structure may be used instead of using a plurality of connector structures for each resonance frequency. Accordingly, a coupling stability of the connector structure may be improved, and mismatch between the plurality of connector structures can be reduced or removed.

Figure 5:
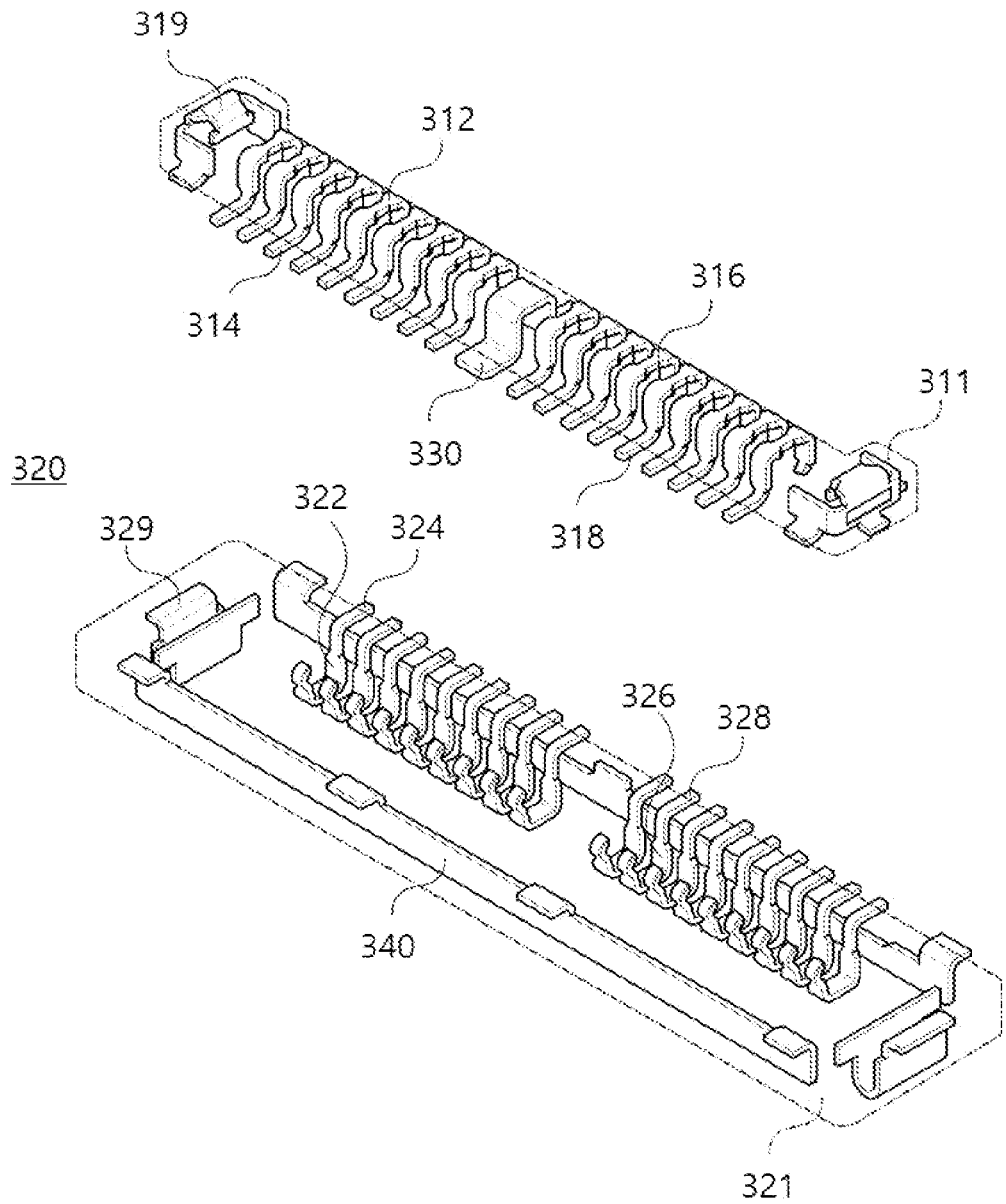
FIGS. 5 and 6 are schematic perspective views illustrating a connector structure included in an antenna package in accordance with some exemplary embodiments.
Figure 6:
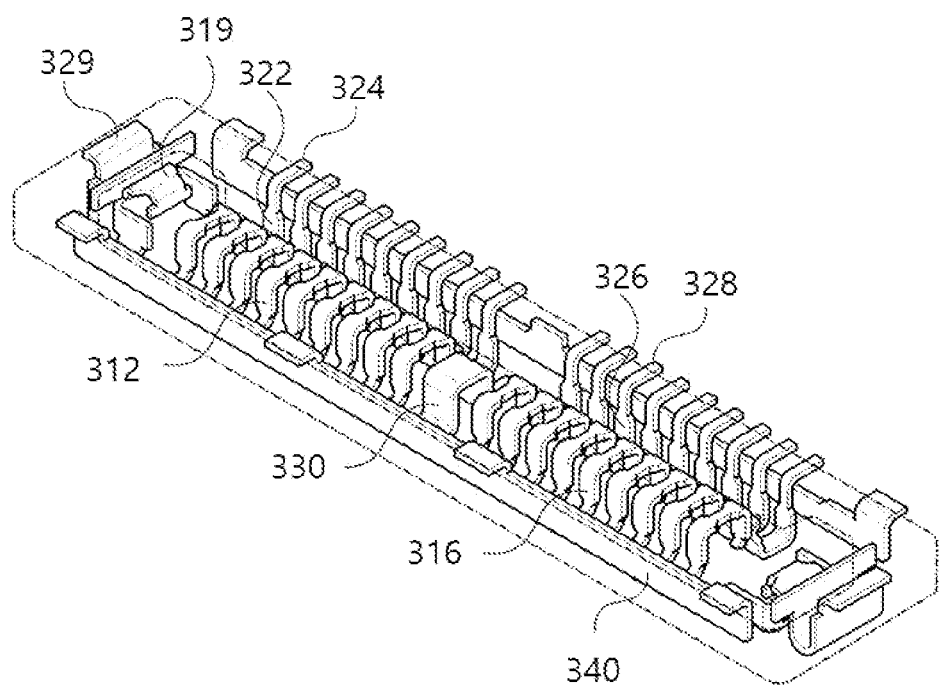
Figure 7:
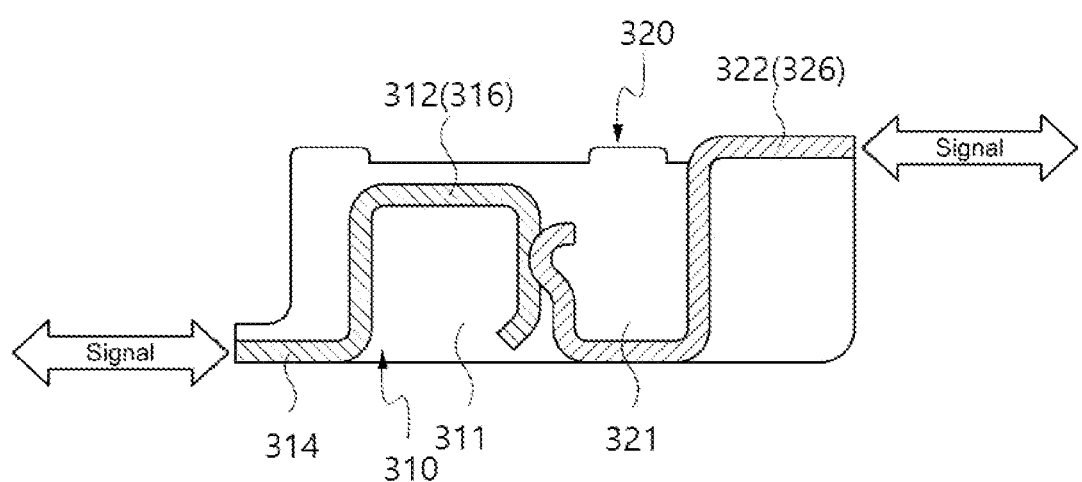
FIG. 7 is a schematic cross-sectional view illustrating a signal transfer through a connector structure in accordance with some exemplary embodiments.

FIGS. 5 and 6 are schematic perspective views illustrating a connector structure included in an antenna package in accordance with some exemplary embodiments. FIG. 7 is a schematic cross-sectional view illustrating a signal transfer through a connector structure in accordance with some exemplary embodiments.

Detailed descriptions of structures and configurations that are substantially the same as or similar to those described with reference to FIGS. 2 to 4 will be omitted.

Referring to FIG. 5, as described above, the first conductive connection terminals 312 and the second conductive connection terminals 316 may form a first pad row having a single row structure in the first connector 310. The third conductive connection terminals 322 and the fourth conductive connection terminals 326 may form second pad rows having a single row structure in the second connector 320.

The first barrier structure 330 may be included in the first connector 310, and the first conductive connection terminal 312 and the second conductive connection terminal 316 that may transmit different signals may be shielded/separated from each other.

The second connector 320 may include the second barrier structure 340 disposed at each of both end portions of the second connector 120 in the length direction. The second barrier structure 140 may extend along a direction of the single row structure. For example, a barrier may be disposed on four sides of the connector structure 300 by the side barrier structures 319 and 329 and the second barrier structure 340.

In some embodiments, a width of each of the aforementioned conductive connection terminals 312, 316, 322 and 326 may be from 100 µm to 150 µm, and a thickness of each of the conductive connection terminals 312, 316, 322 and 326 may be from 40 µm to 80 µm. Within the above range, a volume of the connector structure 300 may be appropriately maintained while implementing an improved signal transmission rate with a reduced resistance.

In some embodiments, a distance between adjacent conductive connection terminals may be from 250 µm to 400 µm. In this case, an appropriate spacing distance between the conductive connection terminals 312, 316, 322 and 326 may be maintained. Accordingly, the volume of the connector structure 300 may be decreased to improve a spatial efficiency while preventing the signal disturbance and interference.

The above-described conductive connection terminals 312, 316, 322 and 326, the barrier structures 330 and 340, and the side barrier structures 319 and 329 may include silver (Ag), copper (Cu), aluminum (Al), nickel (Ni), chromium (Cr), cobalt (Co), molybdenum (Mo), titanium (Ti), palladium (Pd), an oxide or an alloy containing at least one of these metals. These may be used alone or in combination of two or more.

Referring to FIGS. 6 and 7, the first connector 310 and the second connector 320 may be coupled to each other to form the connector structure 300.

In some embodiments, the first conductive connection terminal 312 included in the first connector 310 and the third conductive connection terminal 322 included in the second connector 320 may contact each other at the same level. The second conductive connection terminal 316 and the fourth conductive connection terminal 326 may contact each other at the same level.

Accordingly, the first conductive connection terminal 312 and the third conductive connection terminal 322 may be physically and electrically coupled to each other by a lateral surface contact, and the second conductive connection terminal 316 and the fourth conductive connection terminal 326 may be physically and electrically coupled to each other by a lateral surface contact.

The first connector 310 and the second connector 320 may be coupled through the lateral surface contact at the same level, so that a thickness or a volume of the connector structure 300 may be decreased. Accordingly, the spatial efficiency of the antenna package including the connector structure 300 may be improved.

A current or signal flow through the connector structure 300 may be unified in one direction through the single pad column structure as indicated by "signal" in FIG. 7.

Figure 8:
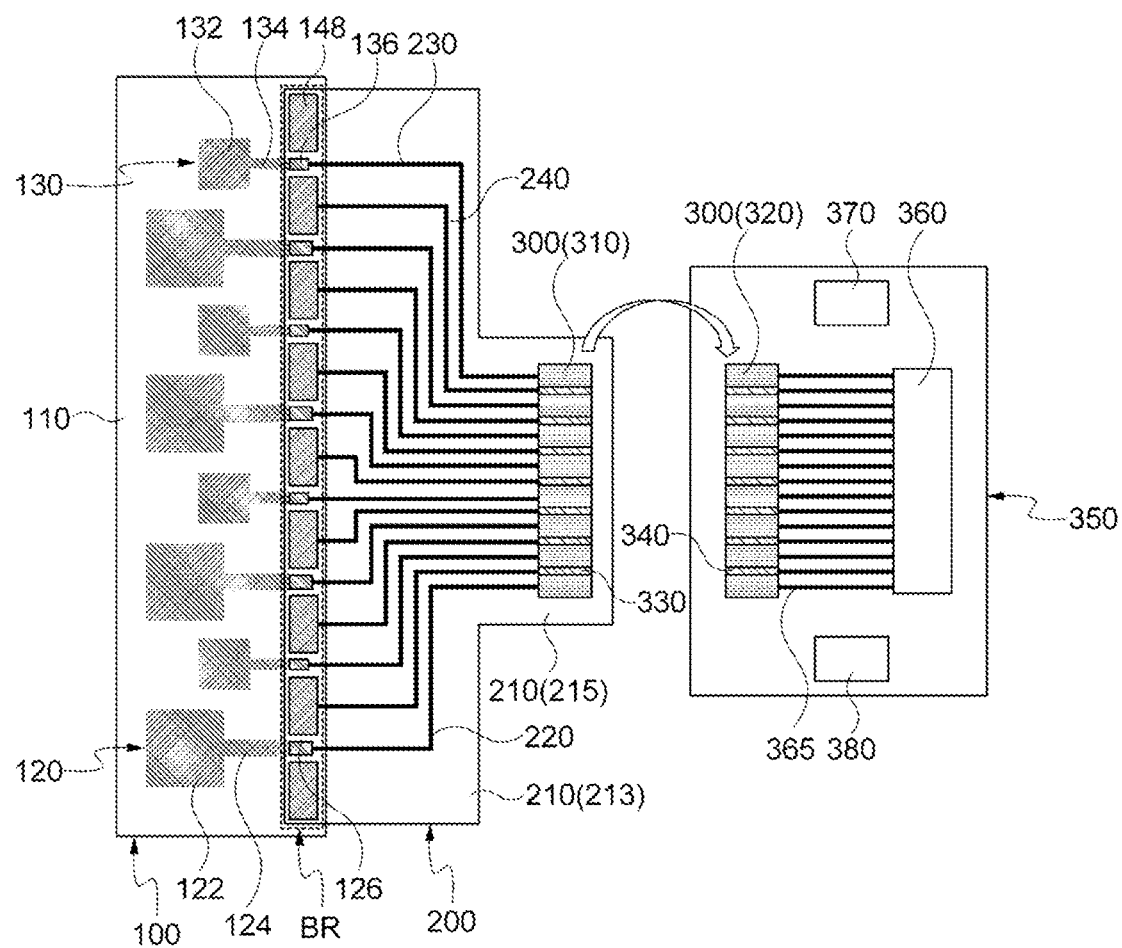
FIG. 8 is a schematic top planar view illustrating an antenna package in accordance with exemplary embodiments.

FIG. 8 is a schematic top planar view illustrating an antenna package in accordance with exemplary embodiments.

Referring to FIG. 8, a plurality of the first antenna units 120 and a plurality of the second antenna units 130 may be repeatedly and alternately arranged along the width direction of the antenna device 100 or the antenna dielectric layer 110 on the antenna dielectric layer 110.

In this case, the first conductive connection terminals 312 and the second conductive connection terminals 316 may also be alternately and repeatedly arranged in the first connector 310, and the third conductive connection terminals 322 and the fourth conductive connection terminals 326 may also be alternately and repeatedly arranged in the second connector 320.

In some embodiments, the first barrier structures 330 may be disposed at each space between the first conductive connection terminal 312 and second conductive connection terminal 316 neighboring each other, and the second barrier structures 340 may be at each space between the third conductive connection terminal 322 and the fourth conductive connection terminal 326 neighboring each other.

In this case, when the first connector 310 and the second connector 320 are coupled to each other, the first conductive connection terminals 312 may be combined with and in contact with the third conductive connection terminals 322, the second conductive connection terminals 316 may be combined with and in contact with the fourth conductive connection terminals 326, and the first barrier structures 330 may be combined with and in contact with the second barrier structures 340 to form the connector structure 300. Accordingly, the disturbance and interference between signals supplied to the first antenna unit 120 and the second antenna unit 130 having different resonance frequencies may be prevented.

For example, the antenna device 100 may further include a plurality of ground pads 148 disposed between the first antenna unit 120 and the second antenna unit 130.

For example, the plurality of ground pads 148 may be electrically connected to each of the plurality of first barrier structures 330. In some embodiments, the plurality of ground pads 148 may be electrically connected to each of the plurality of first barrier structures 330 through each of a plurality of third signal wirings 240.

Accordingly, noise shielding and signal interference prevention effects may be implemented by a combination of the ground pads 148 and the first barrier structure 330, so that the signal interference and signal disturbance between the antenna units 120 and 130 having different resonance frequencies may be reduced and radiation properties may be improved.

Further, a shielding between the alternately arranged conductive connection terminals 312, 316, 322 and 326 may be individually implemented to entirely prevent the signal loss and interference in the connector structure 300. Thus, enhanced radiation efficiency and antenna gain may be achieved while preventing signal disturbance.

Figure 9:
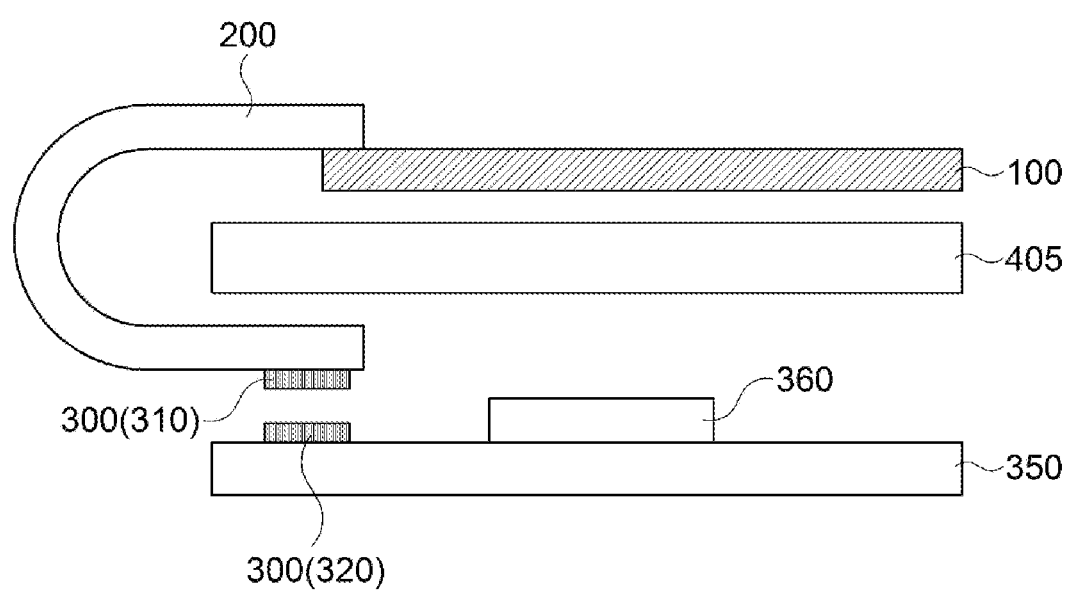
FIGS. 9 and 10 are a schematic cross-sectional view and a schematic top planar view, respectively, illustrating an image display device in accordance with exemplary embodiments.
Figure 10:
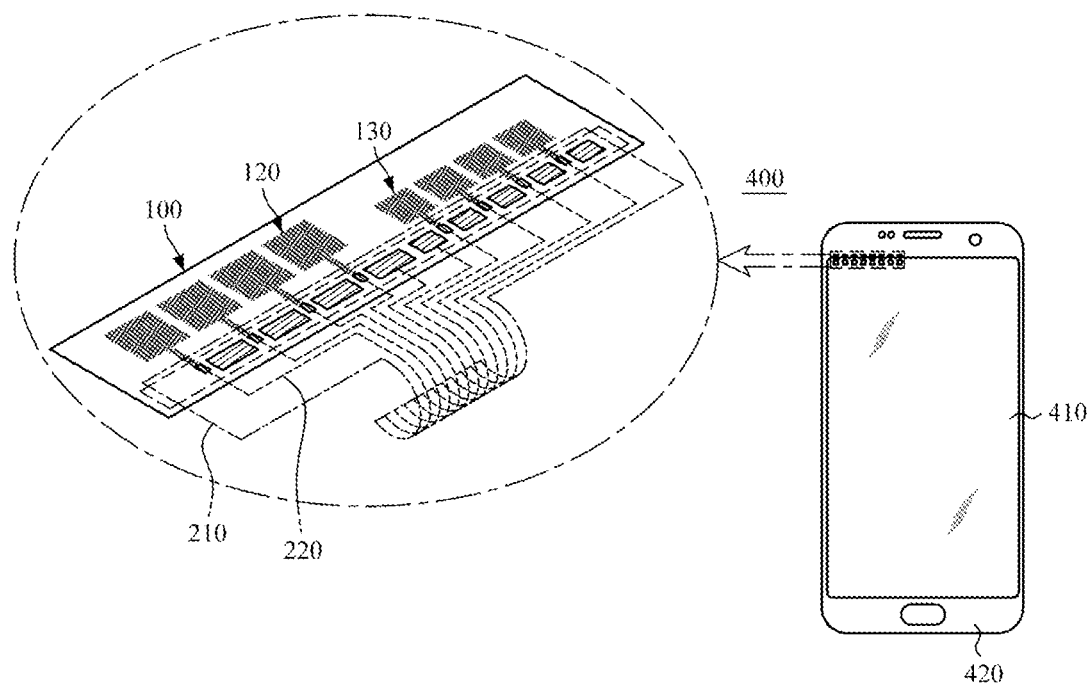

FIGS. 9 and 10 are a schematic cross-sectional view and a schematic top planar view, respectively, illustrating an image display device in accordance with exemplary embodiments.

Referring to FIGS. 9 and 10, an image display device 400 may be implemented in the form of, e.g., a smart phone, and FIG. 10 illustrates a front portion or a window surface of the image display device 400. The front portion of the image display device 400 may include a display area 410 and a peripheral area 420. The peripheral area 420 may correspond to, e.g., a light-shielding portion or a bezel portion of the image display device.

For example, the antenna device 100 included in the above-described antenna package may be disposed on the display panel 405 to face the front portion of the image display device 400. In an embodiment, the radiators 122 and 132 may be at least disposed in the display area 410.

In this case, the radiators 122 and 132 may include a mesh-pattern structure, and a reduction of transmittance due to the radiators 122 and 132 may be prevented. The pads 126, 128, 136 and 138 included in the antenna units 120 and 130 may be formed of a solid metal pattern, and may be disposed in the peripheral area 420 to prevent a degradation of an image quality.

In some embodiments, the first circuit board 200 may be bent by, e.g., the second portion 215 and may extend to the second circuit board 350 (e.g., a main board) on which the antenna driving IC chip 360 is mounted at a rear portion of the image display device 400.

The first circuit board 200 and the second circuit board 350 may be interconnected through the connector structure 300 so that a feeding and an antenna driving control to the antenna device 100 from the antenna driving IC chip 360 may be implemented.

As described above, the barrier structures 330 and 340 that may prevent signal interference and disturbance between the antenna units 120 and 130 having different resonance frequencies may be included in the connector structure 300, so that a high-reliability antenna package operable in high frequency or ultra-high frequency bands may be effectively applied to the image display device 400.

What is claimed is:
1. An antenna package, comprising:
an antenna device comprising a first antenna unit and a second antenna unit physically separated from each other;
a first circuit board electrically connected to the first antenna unit and the second antenna unit; and
a first connector mounted on the first circuit board and electrically connected to the first antenna unit and the second antenna unit, wherein the first connector comprises:
a first conductive connection terminal electrically connected to the first antenna unit;
a second conductive connection terminal electrically connected to the second antenna unit; and
a first barrier structure disposed between the first conductive connection terminal and the second conductive connection terminal.
2. The antenna package of claim 1, wherein the first antenna unit comprises a first radiator, the second antenna unit comprises a second radiator, and the first radiator and the second radiator have different sizes from each other.
3. The antenna package of claim 2, wherein the first antenna unit and the second antenna unit have different resonance frequencies from each other.
4. The antenna package of claim 1, wherein a plurality of the first antenna unit and a plurality of the second antenna unit are arranged in the antenna device in an array form;
a plurality of the first conductive connection terminal is each electrically connected to each of the plurality of the first antenna unit; and
a plurality of the second conductive connection terminal is each electrically connected to each of the plurality of the second antenna unit.
5. The antenna package of claim 4, wherein the first circuit board comprises:
first signal wirings, each of which is bonded to each of the plurality of the first antenna unit and electrically connected to each of the plurality of the first conductive connection terminal; and
second signal wirings, each of which is bonded to the plurality of the second antenna unit and electrically connected to each of the plurality of the second conductive connection terminal.
6. The antenna package of claim 1, further comprising:
a second circuit board comprising a connection wiring;
a second connector mounted on the second circuit board and coupled to the first connector; and
an antenna driving integrated circuit chip mounted on the second circuit board and electrically connected to the second connector through the connection wiring.
7. The antenna package of claim 6, wherein the second connector comprises:
a third conductive connection terminal electrically connected to the first conductive connection terminal;
a fourth conductive connection terminal electrically connected to the second conductive connection terminal; and
a second barrier structure disposed between the third conductive connection terminal and the fourth conductive connection terminal.
8. The antenna package of claim 7, wherein a plurality of the first conductive connection terminal and a plurality of the second conductive connection terminal form a single row structure in the first connector; and
a plurality of the third conductive connection terminal and a plurality of the fourth conductive connection terminal form a single row structure in the second connector.

9. The antenna package of claim 7, wherein the antenna device further comprises an antenna dielectric layer on which the first antenna unit and the second antenna unit are disposed; and
- the antenna device comprises a first radiation group comprising a plurality of the first antenna unit adjacent to each other along a width direction on the antenna dielectric layer; and a second radiation group comprising a plurality of the second antenna unit adjacent to each other in the width direction on the antenna dielectric layer.

10. The antenna package of claim 9, wherein the first connector comprises a first terminal group comprising a plurality of the first conductive connection terminal adjacent to each other to be electrically connected to the first radiation group; and a second terminal group comprising a plurality of the second conductive connection terminal adjacent to each other to be electrically connected to the second radiation group;
- the second connector comprises a third terminal group comprising a plurality of the third conductive connection terminal adjacent to each other to be electrically connected to the first terminal group; and a fourth terminal group comprising a plurality of the fourth conductive connection terminal adjacent to each other to be electrically connected to the second terminal group.

11. The antenna package of claim 10, wherein the first barrier structure is disposed between the first terminal group and the second terminal group, and the second barrier structure is disposed between the third terminal group and the fourth terminal group.

12. The antenna package of claim 1, wherein the first circuit board comprises a third signal wiring electrically separated from the first antenna unit and the second antenna unit and electrically connected to the first barrier structure.

13. The antenna package of claim 12, wherein the antenna device further comprises a first ground pad adjacent to the first antenna unit and a second ground pad adjacent to the second antenna unit; and
- at least one of the first ground pad and the second ground pad is connected to the third signal wiring.

14. The antenna package of claim 1, wherein the antenna device further comprises an antenna dielectric layer on which the first antenna unit and the second antenna unit are disposed; and
- the first antenna unit and the second antenna unit are alternately and repeatedly arranged along a width direction on the antenna dielectric layer.

15. An image display device, comprising:
a display panel; and
the antenna package of claim 6 disposed on the display panel.

* * * * *